United States Patent
Hsu et al.

(10) Patent No.: US 8,450,205 B2
(45) Date of Patent: May 28, 2013

(54) REDUNDANCY DESIGN WITH ELECTRO-MIGRATION IMMUNITY AND METHOD OF MANUFACTURE

(75) Inventors: Louis L. Hsu, Fishkill, NY (US); Conal E. Murray, Yorktown Heights, NY (US); Ping-Chuan Wang, Hopewell Junction, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/474,244

(22) Filed: May 17, 2012

(65) Prior Publication Data

US 2012/0225549 A1 Sep. 6, 2012

Related U.S. Application Data

(62) Division of application No. 13/400,900, filed on Feb. 21, 2012, which is a division of application No. 12/115,817, filed on May 6, 2008, now Pat. No. 8,138,603.

(51) Int. Cl.
*H01L 21/4763* (2006.01)
(52) U.S. Cl.
USPC ..... 438/627; 438/629; 438/642; 257/E21.584
(58) Field of Classification Search
USPC .......... 438/625–629, 642, 648; 257/E21.584, 257/E21.585
See application file for complete search history.

(56) References Cited

U.S. PATENT DOCUMENTS

| | | |
|---|---|---|
| 5,439,731 A | 8/1995 | Li et al. |
| 5,470,788 A | 11/1995 | Biery et al. |
| 6,313,540 B1 | 11/2001 | Kida et al. |
| 6,383,920 B1 * | 5/2002 | Wang et al. ................ 438/639 |
| 6,417,572 B1 | 7/2002 | Chidambarrao et al. |
| 6,566,755 B1 | 5/2003 | Gardner |
| 6,667,552 B1 | 12/2003 | Buynoski |
| 6,713,835 B1 | 3/2004 | Horak et al. |
| 6,992,390 B2 | 1/2006 | Edelstein et al. |
| 7,387,957 B2 * | 6/2008 | Saito et al. ................ 438/618 |
| 7,692,315 B2 | 4/2010 | Watanabe et al. |
| 2001/0015464 A1 | 8/2001 | Tamaki |
| 2005/0112957 A1 * | 5/2005 | Yang et al. ................ 439/758 |
| 2005/0191851 A1 | 9/2005 | Liu et al. |
| 2006/0220120 A1 | 10/2006 | Horch |
| 2007/0130551 A1 | 6/2007 | Chen et al. |

OTHER PUBLICATIONS

Office Action for related U.S. Appl. No. 13/400,900 mailed Jun. 1, 2012.
Office Action for related U.S. Appl. No. 13/400,900 dated Nov. 13, 2012.
Office Action for related U.S. Appl. No. 13/400,900 dated Feb. 12, 2013.

* cited by examiner

*Primary Examiner* — Tuan N. Quach
(74) *Attorney, Agent, or Firm* — Katherine S. Brown; Roberts Mlotkowski Safran & Cole, P.C.

(57) ABSTRACT

An IC interconnect for high direct current (DC) that is substantially immune to electro-migration (EM) damage, and a method of manufacture of the IC interconnect are provided. A structure includes a cluster-of-via structure at an intersection between inter-level wires. The cluster-of-via structure includes a plurality of vias each of which are filled with a metal and lined with a liner material. At least two adjacent of the vias are in contact with one another and the plurality of vias lowers current loading between the inter-level wires.

15 Claims, 12 Drawing Sheets

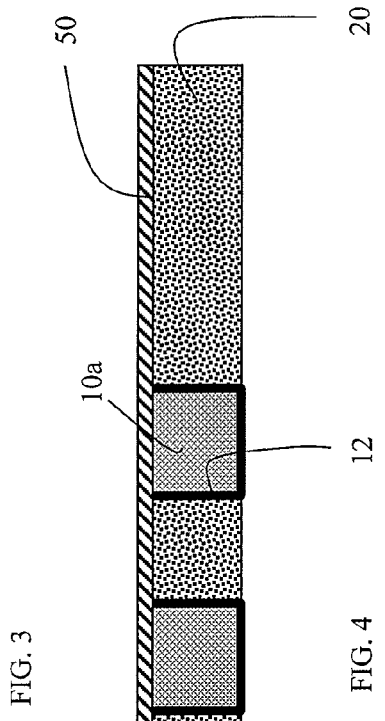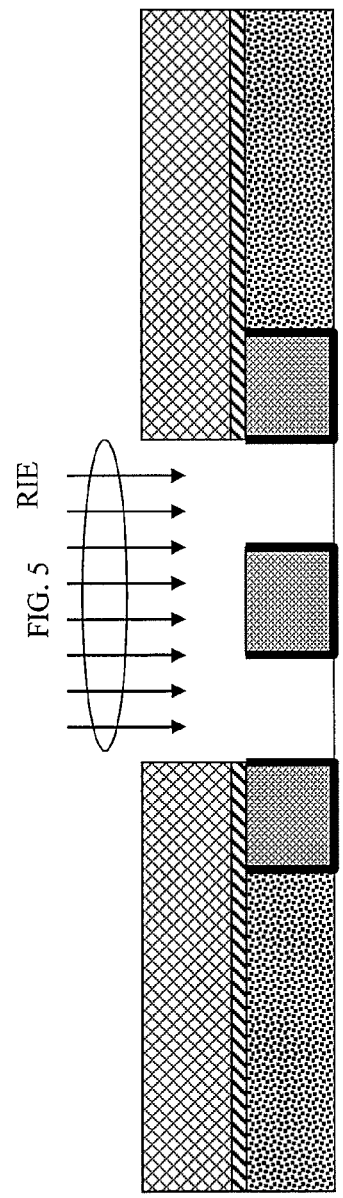
FIG. 3
FIG. 4
FIG. 5

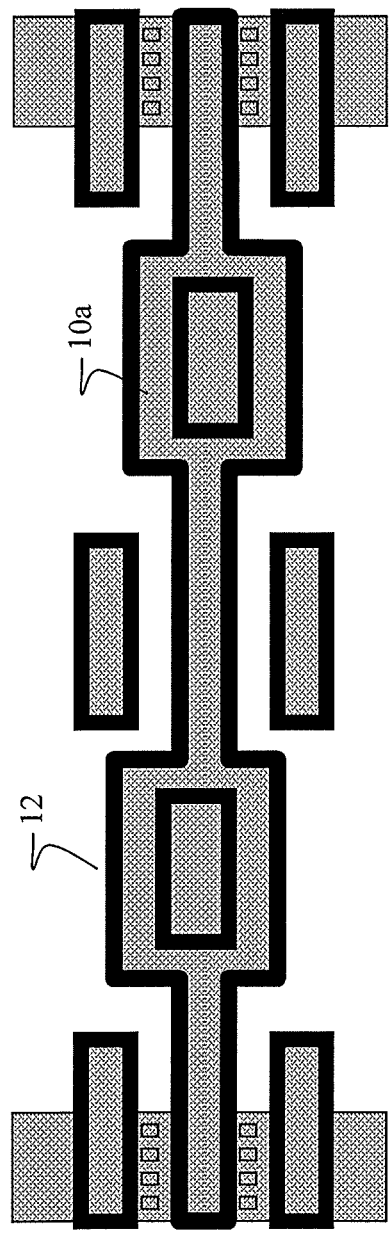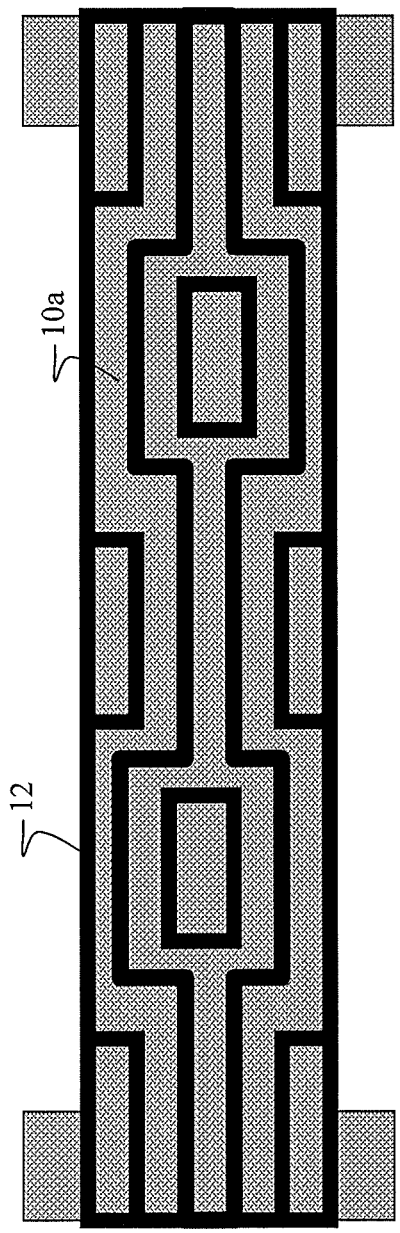
FIG. 9C
FIG. 9D

REDUNDANCY DESIGN WITH ELECTRO-MIGRATION IMMUNITY AND METHOD OF MANUFACTURE

CROSS-REFERENCE TO RELATED APPLICATIONS

The present application is a divisional application of U.S. application Ser. No. 13/400,900, filed on Feb. 21, 2012, which is a divisional application of U.S. application Ser. No. 12/115,817 (U.S. Pat. No. 8,138,603), filed on May 6, 2008, the contents of all are herein incorporated by reference in their entirety.

FIELD OF THE INVENTION

The present invention relates to integrated circuits (ICs), a design structure and a method of manufacturing and, more particularly, to an IC interconnect for high direct current (DC) that is substantially immune to electro-migration (EM) damage, a design structure of the IC interconnect and a method of manufacturing the IC interconnect.

BACKGROUND

Back-end-of-line (BEOL) interconnects, consisting of metal wires and inter-level vias, carry high direct current (DC) in advanced integrated circuit (IC) chip technology. In particular, as IC chip technology advances, the current density required in these metal wires/vias increases with the ever-decreasing dimensions in IC chip technology. Also, self-heating by high current devices raises the temperature of nearby interconnects under circuit operation and makes use of high current carrying BEOL interconnects extremely challenging. For example, a device that uses high current and self-heats (e.g., a resistor, a bipolar transistor, etc.) may heat up an interconnect wire that couples to the device. The high current leads to electro-migration (EM) degradation of the interconnect (via and/or line), causing shorts or opens.

As a result, the current-carrying capability (or the $I_{dc}$ limit specified in the design manuals) is significantly reduced to avoid electro-migration degradation in interconnects. As an example, a direct current limit in a copper interconnect may be reduced by a factor of more than three resulting from a temperature rise of about 15° C. from, for example, 85° C. to 100° C., and by almost a factor of 20 at a 125° C. interconnect temperature. As a result, high direct current at elevated temperatures is almost impossible with conventional interconnect structures.

There are various methods aimed at addressing this reliability issue in metal wires/vias. Known methods, though, result in EM induced voids occurring in any section of the segment, which will cause the wire to eventually open as the void grows in size. Other methods use liners to enclose vias. However, such structures and methods do not provide any means to protect EM damage in metal wires, nor such structures address the EM damage at the via/wire interface.

Accordingly, there exists a need in the art to overcome the deficiencies and limitations described hereinabove.

SUMMARY

In a first aspect of the invention, a structure having electro-migration immunity and redundancy of design, comprises a plurality of wires laid out in parallel and each of which are coated with a liner material. Two adjacent of the wires are physically contacted to each other.

In another aspect of the invention, a structure comprises a cluster-of-via structure at an intersection between inter-level wires. The cluster-of-via structure comprises a plurality of vias each of which are filled with a refractory metal and lined with a liner material. The vias that are adjacent to one another are in contact. The plurality of vias lowers current loading between the inter-level wires.

In a further aspect of the invention, a method to fabricate a ribbon wire structure comprises: forming wires in an insulation material, wrapping the wires with a liner material; forming spaces between the wires by removing the insulating material between adjacent wires; and depositing a metal in the spaces to form additional wires between and adjacent to the wires already formed.

In yet a still further aspect of the invention, a design structure is embodied in a machine-readable medium for designing, manufacturing, or testing an integrated circuit. The design structure comprises a plurality of metal wires laid out in parallel and each of which are coated with a liner material. Two adjacent of the metal wires are physically contacted to each other.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 3-8B shows fabrication processes and respective structures for manufacturing a ribbon-wire structure in accordance with an aspect of the invention;

FIGS. 9C and 9D show fabrication processes and respective structures for manufacturing a jogged-shaped wire structure in accordance with an aspect of the invention;

DETAILED DESCRIPTION

The present invention relates to an IC interconnect for high direct current (DC) that is substantially immune to electro-migration (EM) damage, a design structure of the IC interconnect and a method of manufacture. In implementation, the present invention provides a metal wire design to overcome EM induced damage, which includes a plurality of narrow metal lines (wires). The narrow metal wires are separated from one another by a layer of conductive liner material, which serves as an EM blocking layer as well as a mechanical reinforcement layer within the overall metal wire structure. Such a cluster-of-wire structure carries several unique features, including:

(1) a plurality of fine wires;
(2) each wire is surrounded by the liner material; and
(3) no spacing between any adjacent wires, referred to as ribbon wires.

In further embodiments, a cluster-of-via structure is provided which not only significantly lowers the current loading of each via, but also provides a larger via density (e.g., via opening per unit area) to address electro-migration concerns occurring at the via/wire interface. This approach forms sufficient and robust contact when two wires cross each other, especially for thinner wires.

Redundant Metal Ribbon Wire

Figure 1A:
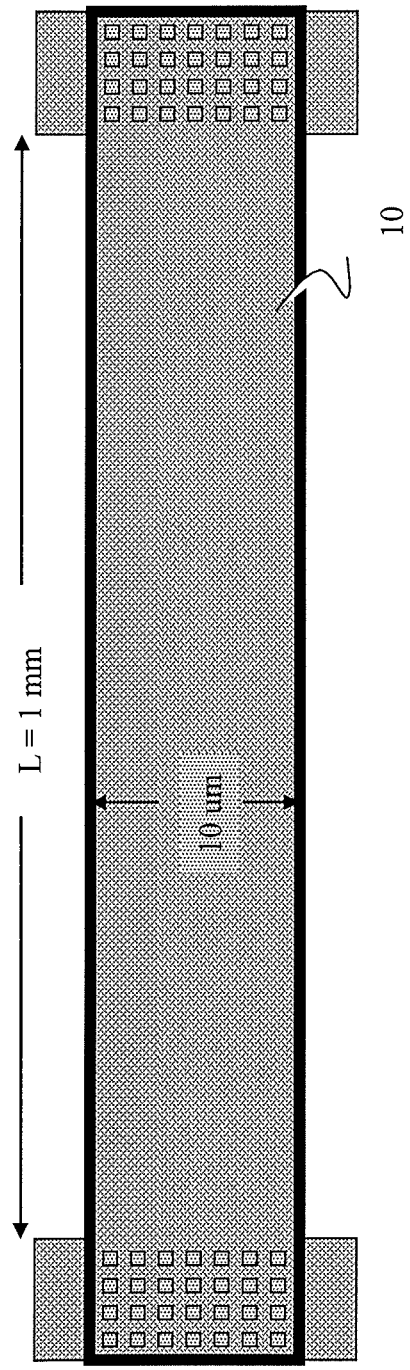
FIG. 1A shows a top view of a conventional wide metal wire.

The present invention provides a metal wire design to overcome EM induced damage. More specifically, FIG. 1A shows a single metal wire line 10. Comparing FIG. 1A to FIG. 1B, the single metal wire is split into a plurality of fine metal (or metal alloy) wires 10a, or a ribbon-wire configuration. The plurality of fine wires 10a may be in parallel to one another, with adjacent wires 10a contacting with one another. In this example, a power supply wire with a width of 10 um (or "w") and length of 1 mm is split into five (or any "n" number) fine wires (all shown as 10a), with each fine wire 10a having a width of 2 um (or width of "n"). Those of ordinary skill in the art should understand, that the wire can be of other dimensions and be split into more or less metal wiring lines, depending on the particular application as discussed herein. As such, the example of FIG. 1B should not be considered a limiting feature of the present invention and is but one illustrative embodiment of the present invention.

Figure 1B:
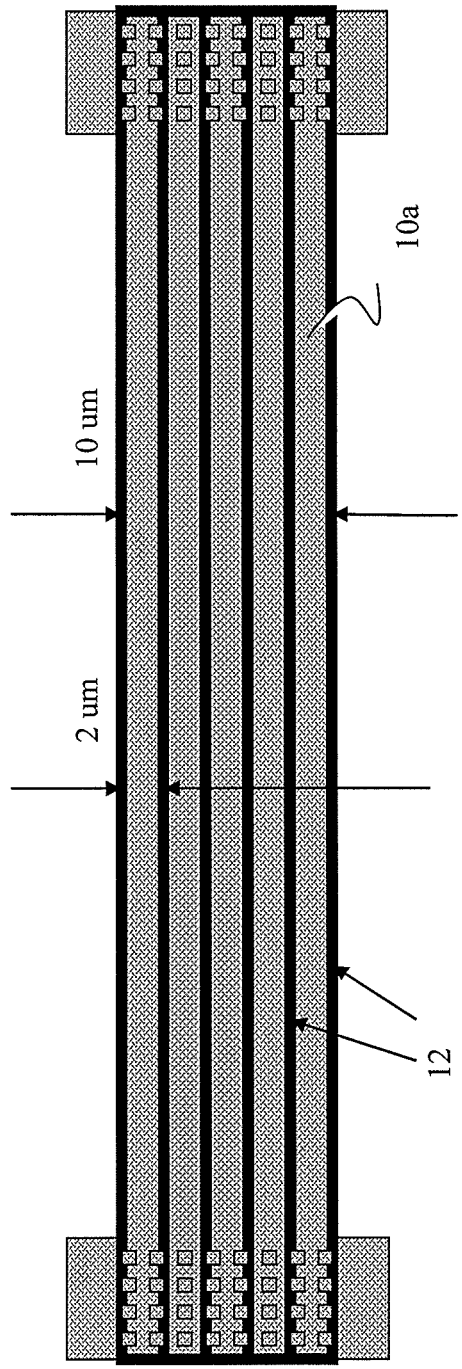
FIG. 1B shows a top view of a metal wire in accordance with an aspect of the invention.

As further seen in FIG. 1B, each fine wire 10a is wrapped with a layer of electrically conductive liner 12. The liner layer comprises refractory metal materials that are electrically conductive and mechanically rigid.

As seen further in FIG. 1B, assuming identical net metal width and pitch for each fine wire 10a, no extra space is provided nor needed between adjacent fine wires 10a. Also, with the liner 12, the overall width of wire design of the present invention may occupy a slightly larger area (e.g., about 1% to 5%) than a conventional design.

In embodiments, the width of the fine wire 10a is narrow enough to promote a bamboo grain structure for improved EM resistance. In this contemplated embodiment, the grain boundaries span across the entire line width and perpendicular to the current flow direction after the metal annealing process, while being wide enough so that its resistivity is not impacted by undesirable electron scattering at the wire/liner interfaces. In general, a width of Al or Cu metal wires range between 0.1 µm and 1 µm, which should be sufficient to result in a bamboo grain structure so as to suppress EM degradation, while their intrinsic resistivities are still maintained. (In a conventional metal layer having a thickness of 0.1 µm to 0.5 µm, the thickness rather than its width predominantly limits the grain size.)

Figure 2A:
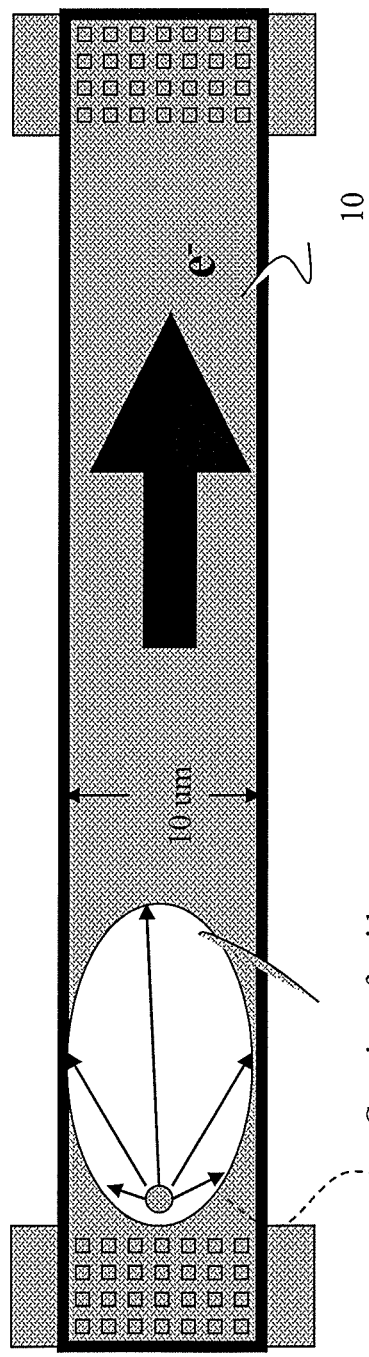
FIGS. 2A and 2B show the electro-migration induced voiding in FIGS. 1A and 1B, respectively.
Figure 2B:
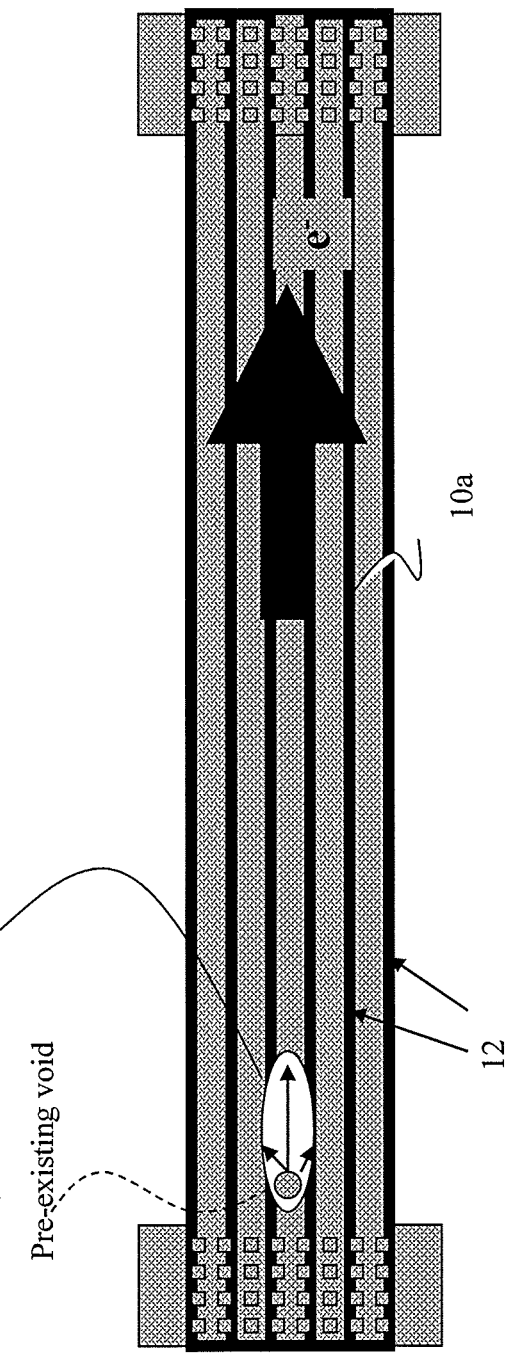

The effectiveness of EM prevention with the disclosed design is shown schematically in FIG. 2B. When a pin-hole or defect exists in a conventional metal wire 10 (see FIG. 2A), the void size will increase as the electron wind flows across the metal line (arrow). The size of the void will continue to grow during the lifetime of the circuits. This will ultimately deplete the metal wire and open the metal wire, at which moment EM permanently damages the circuit. On the other hand, if the same pin hole or defect occurs at the same location of the disclosed ribbon-wire with plurality of fine wires 10a, the void will only grow within a single fine wire and will be confined and quarantined by the liner 12 as seen in FIG. 2B. Such a confined defect will not significantly damage the whole wire structure, and thus the disclosed ribbon-wire provides redundancy against EM damage and greatly extends the lifetime of the metal wire.

FIGS. 3-8 show respective processing steps for fabricating the structure of FIGS. 1B and 2B. As shown in FIG. 3, three fine wires 10a are formed in an insulation material 20 via a conventional method. Liner material 12 wraps the fine wires 10a. A hard cap layer 50 is formed on top of the insulating material 20, which serves as CMP (chemical-mechanical-polish) stop layer.

Figure 6:
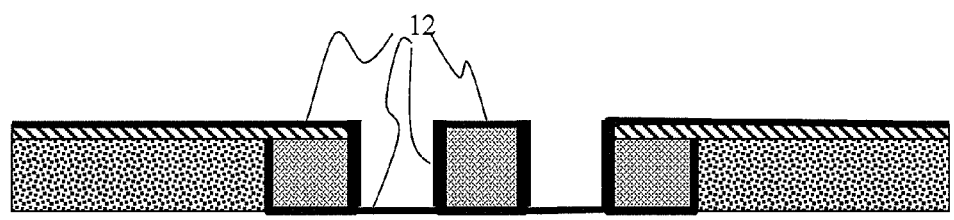

As seen in FIG. 4, a photo-resist mask 60 is used to remove the insulating material 20 between adjacent fine wires 10a. More specifically, using a conventional lithographic process, an opening 65 is formed in the photo-resist mask 60 about selective adjacent fine wires 10a. As seen in FIG. 5, a selective RIE (reactive ion etching) process is performed to remove the insulating material 20 between adjacent fine wires 10a without damaging the fine wires 10a and liner material 12. As seen in FIG. 6, the liner material 12 is re-deposited which conformally coats the etched surface 80.

Figure 7:
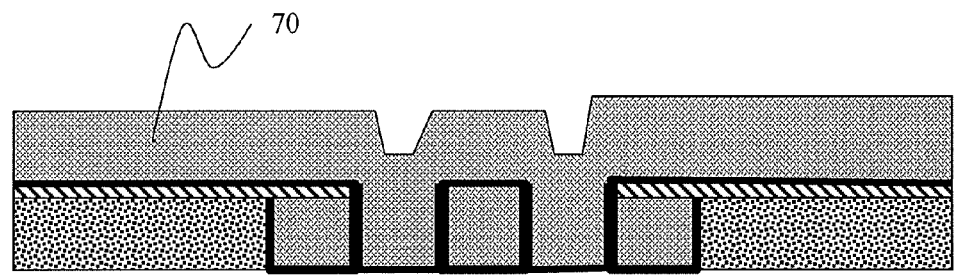
Figure 8A:
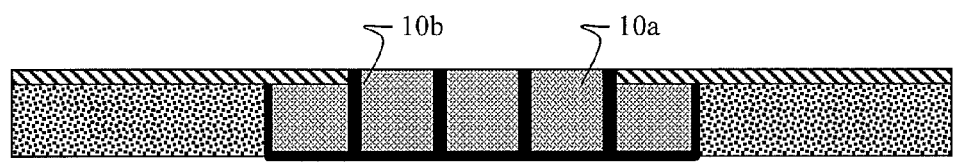
Figure 8B:
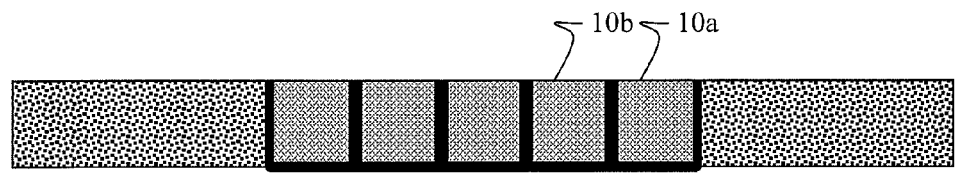

As seen in FIG. 7, a layer of metal 70 is then deposited on the structure of FIG. 6. As seen in FIG. 8A, the metal 70 forms the ribbon-wire after a CMP process step. That is, the metal forms additional fine metal wires 10b. This forms the ribbon structure of the present invention. In FIG. 8B, the hard cap layer 50 can be removed using conventional stripping processes.

With this approach, layers of liners are presented between two adjacent metal wires. These liner layers can effectively quarantine the void growth due to EM. Also, each fine wire within the ribbon-wire serves as independent interconnects which connect two nodes. The ribbon-wire structure provides redundant links, which remains functional even when any of the links is defective due to defect or EM damage.

Figure 9A:
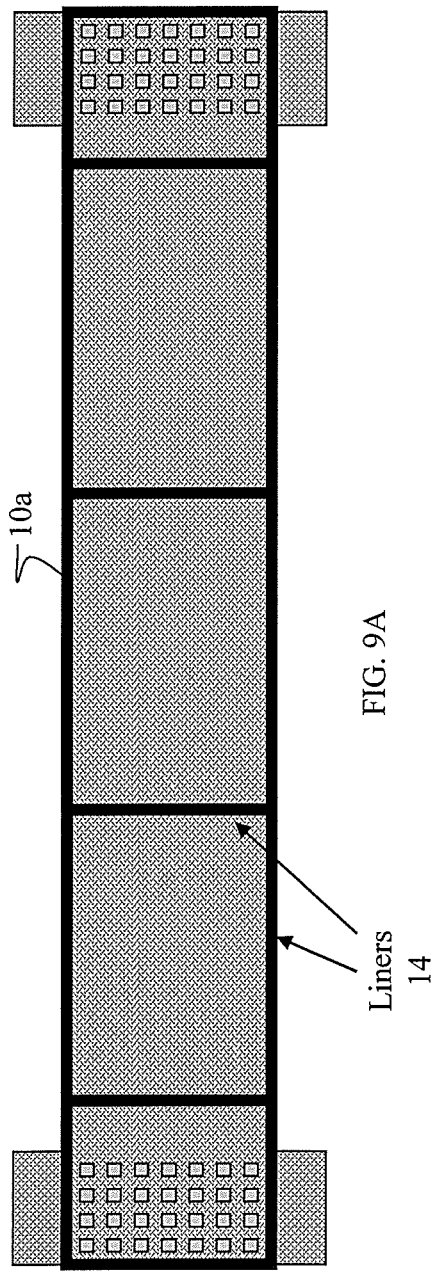
FIG. 9A shows a top view of a conventional wide metal wire.
Figure 9B:
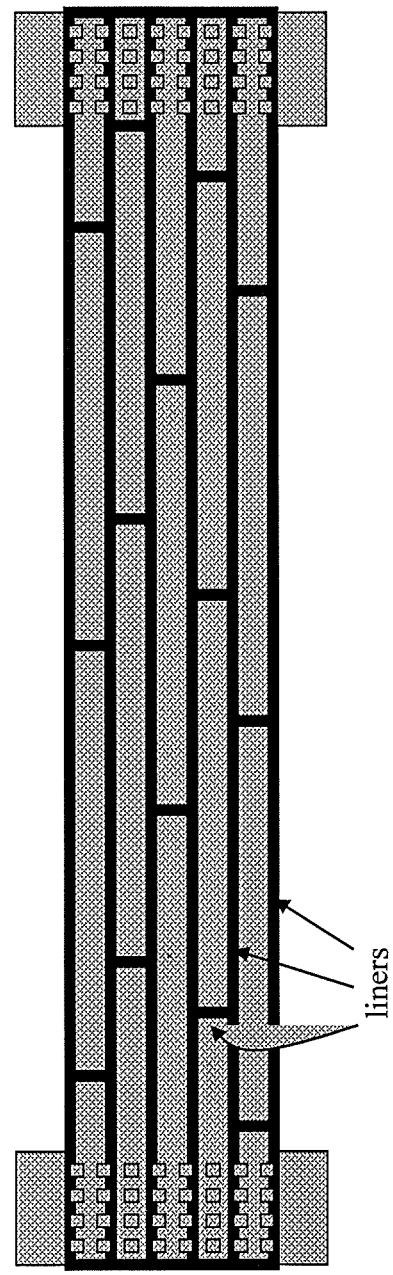
FIG. 9B shows a top view of a metal wire in accordance with an aspect of the invention.

Further embodiments of using liners as barrier layers against EM damage are shown in FIGS. 9A and 9B. In FIG. 9A, additional liner layers 14, or walls, can be oriented perpendicular to the length of the entirety of the metal wires. Alternatively, in FIG. 9B, additional liner layers 14, or walls, are oriented perpendicular to the length of individual fine wires within the ribbon-wire. These liners 14 and all other liners can be placed in any strategic location by etching and filling via conventional phase shift lithography technique, with aluminum being patterned using dry etching. For example in FIG. 9B the perpendicular liner material can be offset between adjacent of the individual metal wires.

In another embodiment, liners 12 can be placed in a direction perpendicular to the fine wires 10a to adopt jogged-shaped wiring lines as shown in FIG. 9C and FIG. 9D. For example, using double Damascene processes the shape of the first metal patterns (FIG. 9C) and second metal patterns (FIG. 9D) can be irregular. The design of these metal shapes can be generated using software simulation based on optimization of both conductivity and EM protection. In other words, the shaped metal pattern can be designed to yield the best EM protection for multi-void cases. As discussed herein, these additional liners 12 serve as barriers to contain EM voiding along the line length direction. Also, these liners 12 provide extra mechanical reinforcement to enhance the rigidity of the overall wire, which improves EM resistance. Also, these additional liners 12 within the fine wire 10a will not have significant impact on the total wire resistance, since the thickness of these liners 12 is about 20 nm or less.

Cluster-of-Vias

Figure 10A:
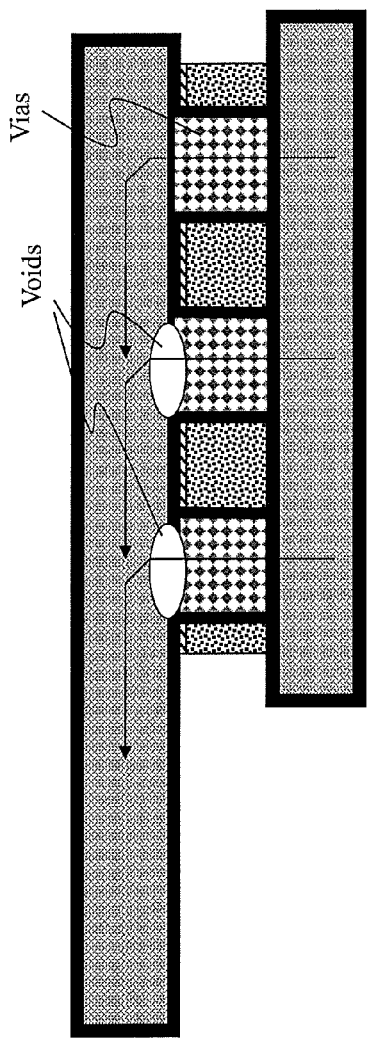
FIG. 10A shows a conventional via configuration.

Vias provide electrical contact between inter-level metal wires. Vias filled with refractory metals, such as tungsten (W), are not prone to EM damage, but they have higher resistivity than metals (e.g. Al or Cu) used for wiring levels. To reduce via resistance, Al and Cu metals are also used to form vias for multiple-level metal interconnections. However, a bottleneck of wiring resistance still often occurs at via levels, especially at those places where there are an insufficient number of via contacts. As seen in FIG. 10A, voids are typically found at the upper portion of the vias due to the EM effect, which eventually leads to an electrical open. Under such an event, current loading of the remaining vias is exacerbated and EM damage is accelerated there.

Figure 10B:
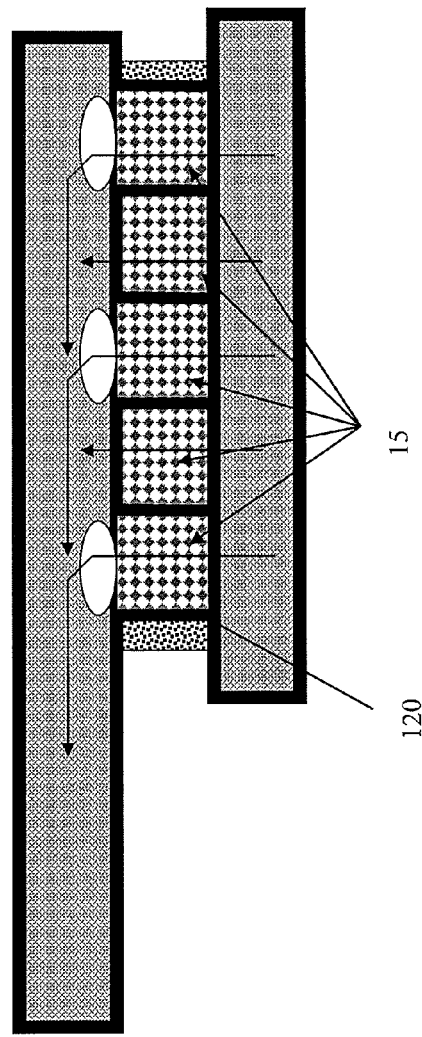
FIG. 10B shows a side view of a cluster-of-via structure in accordance with an aspect of the invention.

In order to avoid this situation, the present invention uses a formation of a cluster-of-via structure which not only significantly lowers the current loading of each via but also provides more redundant vias per unit area with respect to EM concerns. More specifically, as seen in FIG. 10B, a cluster of vias 15 is formed with liner material 120 therebetween. The vias are filled with refractory metal and, in embodiments, are parallel to one another. The cluster of vias effectively lowers the resistance of the structure and prevents the formation of EM voids from opening a circuit. This approach is necessary to produce sufficient contact when two wide wires cross each other.

Figure 11A:
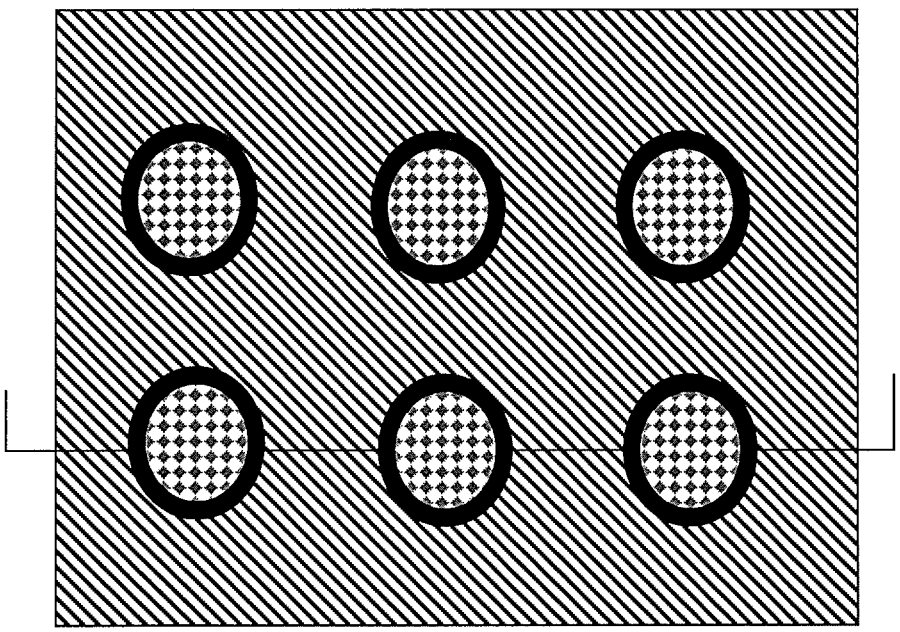
FIGS. 11A-16B show several fabrication processes and respective structures for manufacturing the cluster-of-via structure in accordance with the invention.
Figure 11B:
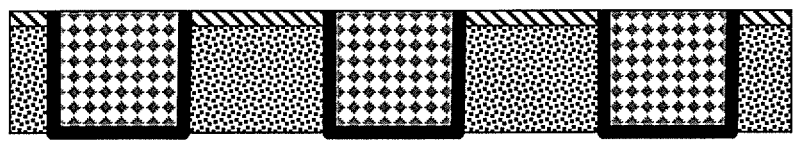
Figure 12A:
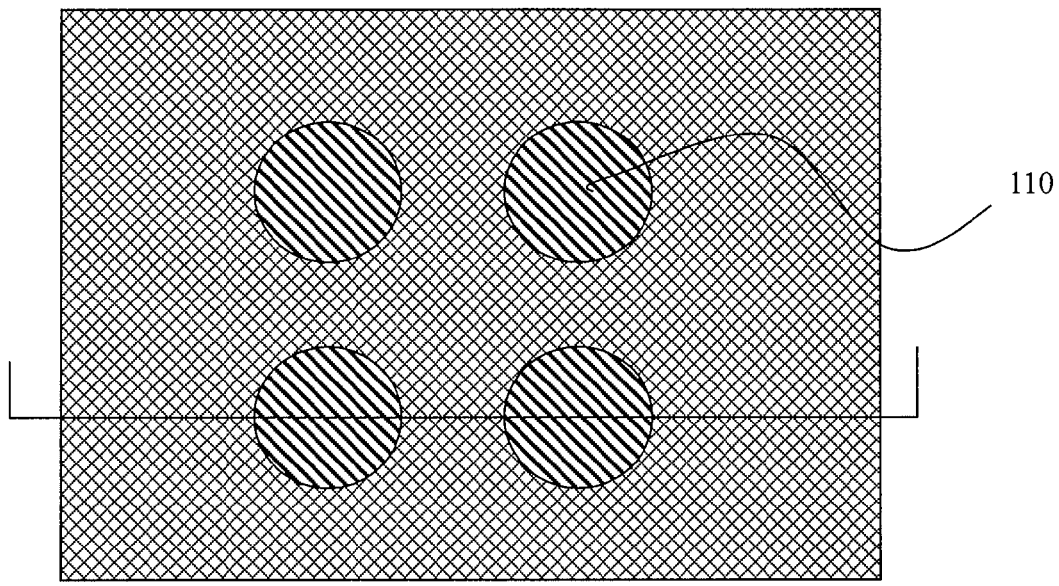
Figure 12B:
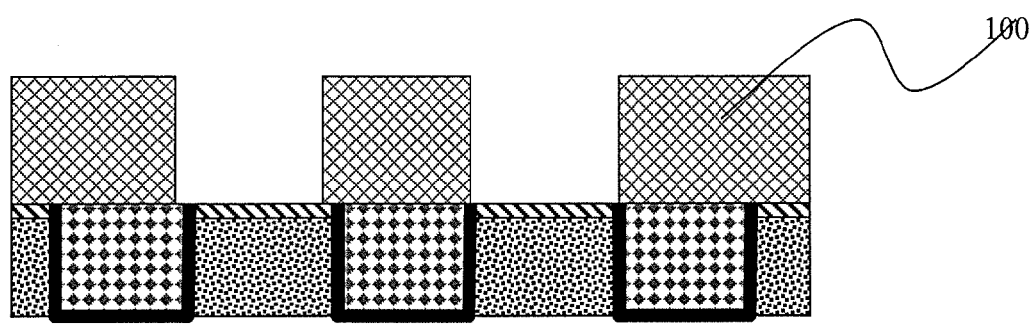
Figure 13:
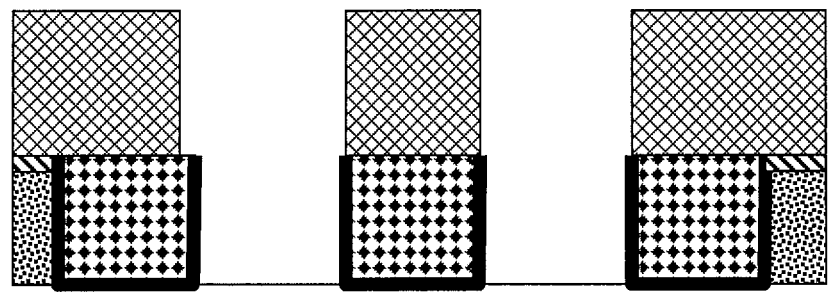
Figure 14:
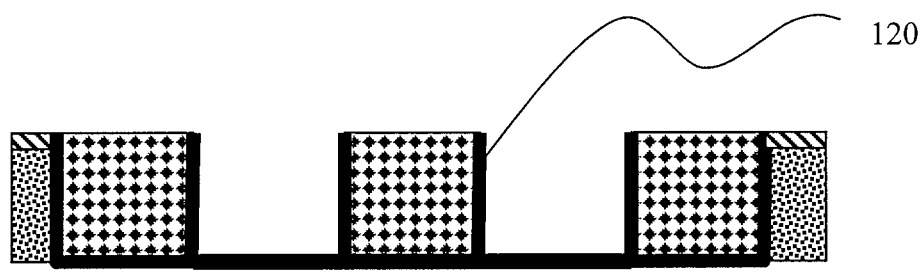
Figure 15:
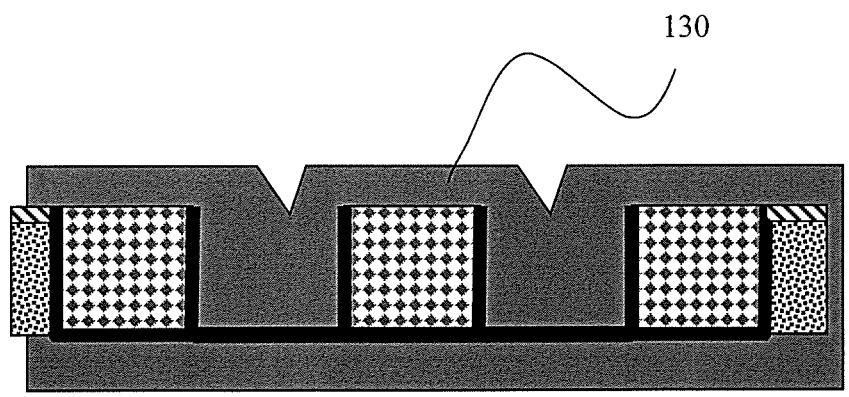

FIGS. 11A to 16B show method steps for forming the structure of FIG. 10B. FIG. 11A is a top-view of a plurality of vias 15, which are formed using a conventional via formation method. The corresponding cross-sectional view is shown in FIG. 11B. A mask 100 is used to print redundant via patterns 110. The top and cross-sectional views of redundant via patterning are shown in FIGS. 12A and 12B, respectively.

Figure 16A:
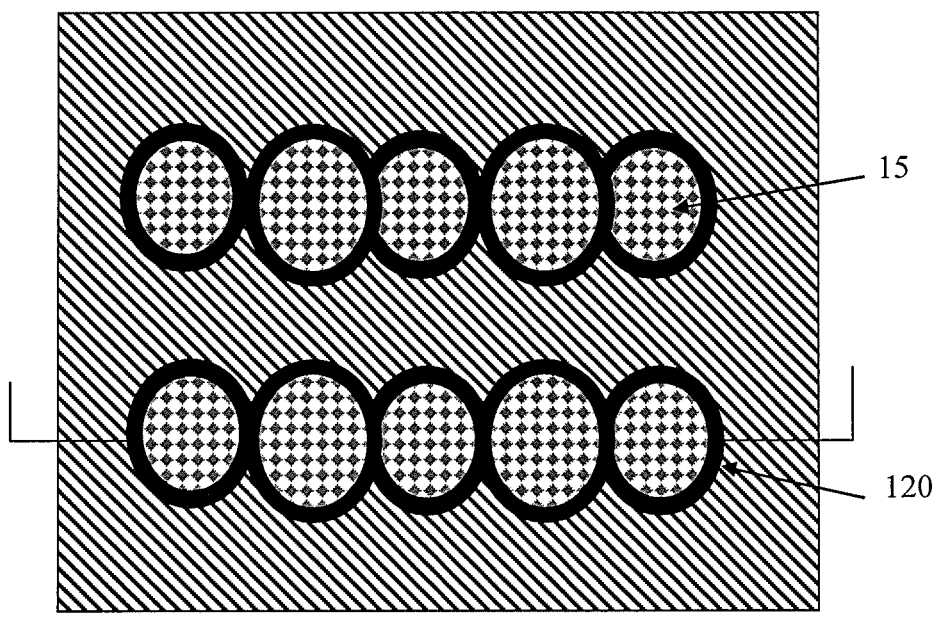
Figure 16B:
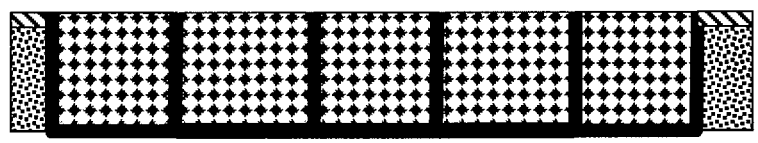

The second set of vias are aligned and formed in between the first set of vias. The insulating material is removed in FIG. 13 using a conventional RIE etching processes. Liner materials 120 are deposited after the removal of photo-resist in FIG. 14. After metal deposition 130, shown in FIG. 15, and CMP, the final cluster-of-via structure is formed by use of conventional deposition processes (see, FIGS. 16A and 16B). As shown in FIGS. 16A and 16B, the vias 15 are clustered together with liner material 120 therebetween.

Design Structure

Figure 17:
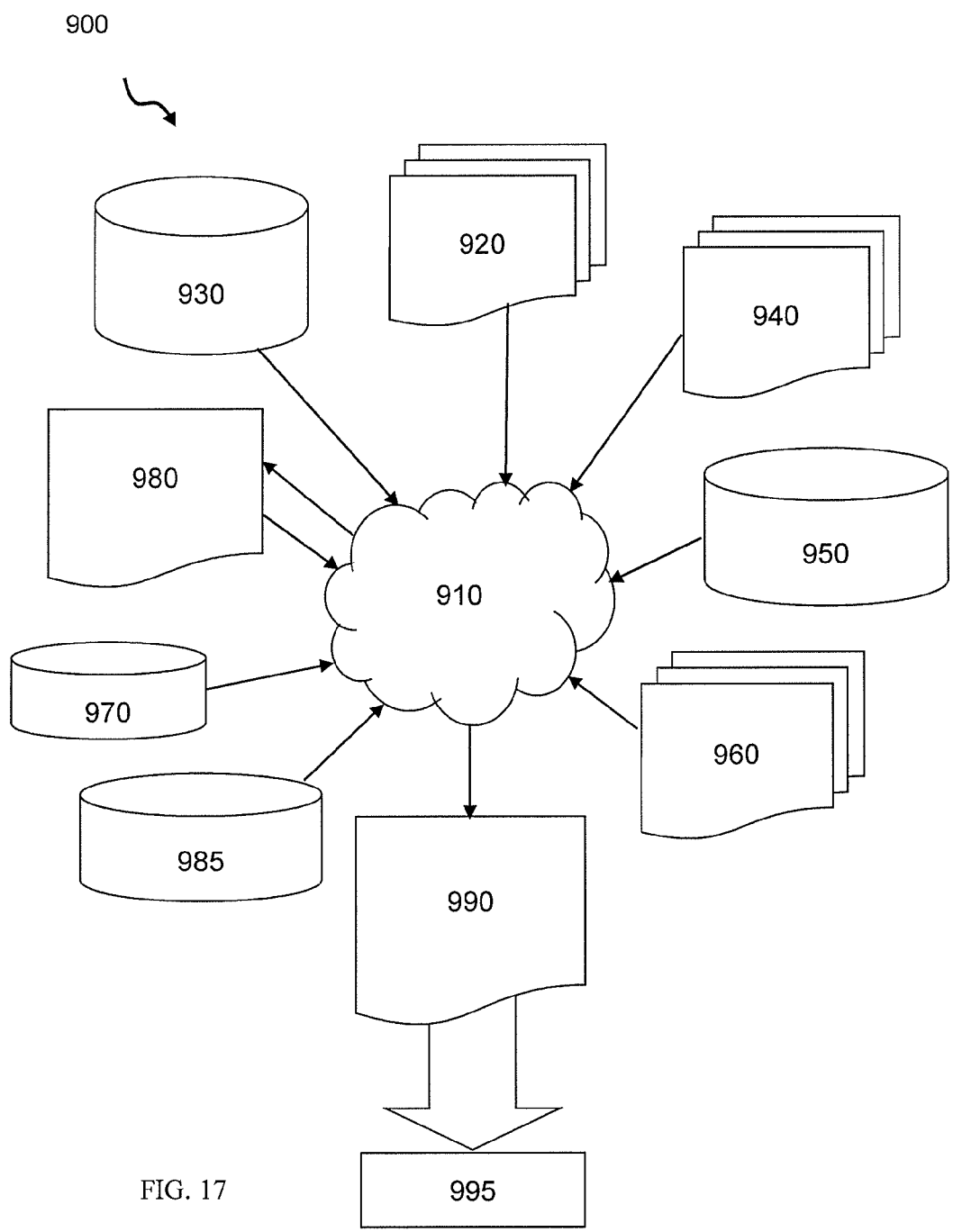
FIG. 17 is a flow diagram of a design process used in semiconductor design, manufacture, and/or test.

FIG. 17 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure 920 comprises an embodiment of the invention as shown in FIGS. 1B, 2B, 9A-9D and 10B in the form of schematics or HDL, a hardware-description language (e.g., Verilog, VHDL, C, etc.).

Design structure 920 may be contained on one or more machine readable medium. For example, design structure 920 may be a text file or a graphical representation of an embodiment of the invention as shown in FIGS. 1B, 2B, 9A-9D and 10B. Design process 910 preferably synthesizes (or translates) an embodiment of the invention as shown in FIGS. 1B, 2B, 9A-9D and 10B into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information).

Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIGS. 1B, 2B, 9A-9D and 10B, along with any additional integrated circuit design or data (if applicable), into a second design structure 990. Design structure 990 resides on a storage medium in a data format used for the exchange of layout data of integrated circuits (e.g. information stored in a GDSII (GDS2), GL1, OASIS, or any other suitable format for storing such design structures). Design structure 990 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1B, 2B, 9A-9D and 10B. Design structure 990 may then proceed to a stage 995 where, for example, design structure 990: proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method to fabricate a ribbon wire structure comprising:
    forming wires in an insulation material;
    wrapping the wires with a liner material;
    forming spaces between the wires by removing the insulation material between adjacent liners on the sidewalls of the wires; and
    depositing a metal layer in the spaces to form additional wires, between and adjacent to the wires already formed, wherein the additional wires share the liner material on the sidewalls of the wires, on a same wiring level.

2. The method of claim 1, further comprising planarizing the deposited metal layer.

3. The method of claim 1, wherein adjacent ones of the wires and the additional wires are devoid of insulation material therebetween.

4. The method of claim 1, wherein the wires and the additional wires form a cluster-of-via structure at an intersection between inter-level wires.

5. The method of claim 4, wherein the liner material covers a top side of each of the wires and the additional wires, and the liner material is shared with a top one of the inter-level wires.

6. The method of claim 4, wherein the liner material covers a bottom side of each of the wires and the additional wires, and the liner material is shared with a bottom one of the inter-level wires.

7. The method of claim 1, wherein the forming spaces comprising etching the insulation material using a reactive ion etching process.

8. The method of claim 7, further comprising redepositing the liner material to conformally coat the etched surface.

9. The method of claim 8, wherein the metal layer is deposited in the space after the etching.

10. The method of claim 9, wherein the metal layer forms a ribbon-wire after a chemical mechanical process step.

11. The method of claim 1, further comprising forming a bottom liner within the spacers, prior to depositing of the metal layer.

12. The method of claim 11, wherein the depositing of the metal layer includes a blanket deposition of the metal layer in the spaces, and over the liner material formed over a surface of the insulation material adjacent the spaces.

13. The method of claim 12, wherein the liner material formed over the insulation material is formed prior to the deposition of the metal layer, and prior to the formation of the liner material and a hard cap formed over the insulation material.

14. The method of claim 13, wherein liner material is formed directly on the hard cap.

15. The method of claim 14, wherein the liner material, the hard cap and the metal layer are planarized.

* * * * *